United States Patent
Sellmer

(10) Patent No.: US 8,932,408 B2
(45) Date of Patent: Jan. 13, 2015

(54) METHOD FOR CLEANING A SURFACE

(75) Inventor: Reinhard Sellmer, Villach (AT)

(73) Assignee: Lam Research AG, Villach (AT)

( * ) Notice: Subject to any disclaimer, the term of this patent is extended or adjusted under 35 U.S.C. 154(b) by 1063 days.

(21) Appl. No.: 12/523,759

(22) PCT Filed: Jan. 9, 2008

(86) PCT No.: PCT/EP2008/050180
§ 371 (c)(1),
(2), (4) Date: Jul. 20, 2009

(87) PCT Pub. No.: WO2008/090019
PCT Pub. Date: Jul. 31, 2008

(65) Prior Publication Data
US 2010/0012157 A1    Jan. 21, 2010

(30) Foreign Application Priority Data

Jan. 22, 2007  (AT) .................................. A 105/2007

(51) Int. Cl.
*B08B 3/02* (2006.01)
*H01L 21/67* (2006.01)

(52) U.S. Cl.
CPC . *B08B 3/02* (2013.01); *B08B 3/022* (2013.01); *B08B 3/024* (2013.01); *H01L 21/67051* (2013.01)

USPC .................. 134/26; 134/28; 134/29; 134/33; 134/34

(58) Field of Classification Search
None
See application file for complete search history.

(56) References Cited

U.S. PATENT DOCUMENTS

| 5,634,980 A * | 6/1997 | Tomita et al. .................... 134/3 |
| 5,896,875 A | 4/1999 | Yoneda |
| 2003/0084925 A1 | 5/2003 | Nakajima et al. |
| 2004/0200513 A1 * | 10/2004 | Okuda et al. ............... 134/102.1 |
| 2006/0174920 A1 | 8/2006 | Randhawa |
| 2006/0281326 A1 | 12/2006 | Ose et al. |
| 2009/0050176 A1 * | 2/2009 | Pfeuffer ......................... 134/1.3 |

OTHER PUBLICATIONS

International Search Report dated Apr. 17, 2008, from corresponding PCT application.

* cited by examiner

*Primary Examiner* — Michael Kornakov
*Assistant Examiner* — Ryan Coleman
(74) *Attorney, Agent, or Firm* — Young & Thompson

(57) ABSTRACT

A method for cleaning a surface of a plate-like article includes the steps of:
  treating the surface with free flow cleaning, wherein liquid is dispensed through a dispense nozzle onto the surface in a continuous liquid flow, and
  treating the surface with spray cleaning, wherein liquid is directed through a spray nozzle towards the surface in form of droplets. The surface is treated with a spray cleaning step before the free flow cleaning step and a spray cleaning step after the free flow cleaning step.

20 Claims, No Drawings

METHOD FOR CLEANING A SURFACE

BACKGROUND OF THE INVENTION

1. Field of the Invention

The invention relates to a method for cleaning a surface of a plate-like article.

2. Description of the Related Art

Such plate-like articles can be disc-like articles such as semiconductor wafers, or compact discs as well as polygonal articles such as flat panel displays. Such cleaning methods are typically used for removing particles from structured surfaces of semiconductor wafers.

A so far unsolved dilemma of removing particles from a surface is the following. Particles typically adhere to the surface and can only be removed by mechanical energy. The higher the mechanical energy, which is introduced to the surface the better the removal efficiency. The negative effect is that the higher the mechanical energy, which is used in a particle removing process, the more stress is applied to the surface, which on the other hand shall be unaffected. Therefore it was thought that particle removing efficiency cannot be improved for a given removing technique without accepting more damage to the surface.

For semiconductor structures damages however are unacceptable. Mechanical agitation for particle removal is therefore the existing problem, which increases when structures become smaller.

SUMMARY OF THE INVENTION

It is thus an object of the invention to provide a cleaning method which is capable of effectively removing particles without significantly damaging the surface of a plate-like article (especially of a structured semiconductor wafer.)

The invention meets the objects by providing a method for cleaning a surface of a plate-like article comprising the steps of treating the surface with free flow cleaning, wherein liquid is dispensed through a dispense nozzle onto the surface in a continuous liquid flow; treating the surface with spray cleaning, wherein liquid is directed through a spray nozzle towards the surface in form of droplets; wherein the surface is treated with a spray cleaning step before the free flow cleaning step and a spray cleaning step after the free flow cleaning step.

DETAILED DESCRIPTION OF THE INVENTION

The droplets of the spray have a mean diameter ($D_{30}$) of between 0.001 mm and 0.1 mm (1-100 μm). The mean diameter ($D_{30}$) as for this application is based on the volume distribution and calculated as follows:

$$D_{30}=(\Sigma D_i^3 N_i/\Sigma N_i)^{(1/3)},$$

wherein $D_i$ is the mean droplet diameter of each size class i of a sample and $N_i$ is the number of droplets in each size class i.

In one embodiment a sequence of a free flow cleaning step followed by a spray cleaning step is carried out at least twice.

Advantageously the sequence of a free flow cleaning step followed by a spray cleaning step is carried out at least three times.

In another embodiment at least one of the free flow cleaning steps utilizes an alkaline cleaning liquid and/or spray cleaning step B comprises an oxidizing agent selected from the group of ozone, hydrogen peroxide and a mixture of ozone, and hydrogen peroxide.

Preferably the cleaning liquid comprises ammonia. Useful cleaning liquids are e.g. aqueous solutions including hydrogen peroxide and ammonia with a water content of 80 to 99.8 wt. %.

In another embodiment at least one of the spray cleaning steps utilizes a cleaning liquid selected from the group comprising water, organic solvent alkaline composition, and acidic composition.

When the free low cleaning step and the spray cleaning step timely overlap not more than 5 s this helps to keep the surface wet during cleaning however to limit splashes.

If the plate-like article is rotated during at least one cleaning step cleaning is performed evenly across the wafer. Alternatively the nozzles (spray nozzle and/or free flow nozzle) may scan across the wafer whilst the plate-like article keeps unmoved.

Advantageously the spray cleaning step utilizes a spray nozzle selected from the group airless spray nozzle, two phase nozzle with inner mixing or two phase nozzle with outer mixing.

Preferably the spray cleaning step utilizes a two phase nozzle with outer mixing.

In one embodiment the spray nozzle's orifice is located at a distance d to the plate-like article's surface of d being in a range of 0.1 cm to 10 cm. preferably 0.3 cm to 5 cm.

In another embodiment at least two of the spray cleaning steps are run for a time period for each spray cleaning step of 5 s to 45 s each; preferably 8 s to 30 s.

In yet another embodiment at least two of the free flow cleaning steps are run for a time period for each free flow cleaning step of each 5 s to 45 s each; preferably 8 s to 30 s.

Preferably the spray nozzle scans laterally across the plate-like article; e.g. whilst the plate-like article is rotating.

The lateral movement parameters as speed, width and the derivation of speed over width may be controlled, so that the nozzle scans across the plate-like article so that each point of the plate-like article's surface is treated for the same period of time.

Advantageously the plate-like article rotates during spray cleaning and the spray nozzle moves radially across the surface from the rotational center to the plate-like article's edge.

Further details of the invented method become apparent when reading the description of a preferred embodiment.

A structured 300 mm semiconductor wafer is placed onto a spin chuck of a spin processor. Alternatively, before the cleaning process a layer on the wafer can be etched or stripped (e.g. with a mixture of concentrated sulfuric acid and hydrogen peroxide)

$1^{st}$ step (pre-rinsing step R): rinsing liquid (de-ionized water) at a flow rat of 5 l/min is supplied onto the center of the wafer while it is spun at a spin speed of 300 rpm.

$2^{nd}$ step (free flow step A): a diluted SC1 (0.7 vol.-% 32% hydrogen peroxide; 28.4 vol.-% 35% ammoniac water; 70.9 vol.-% water) is dispensed at 40° C. at a flow rate of 10 l/min onto the wafer while it is spun at a spin speed of 600 rpm.

$3^{rd}$ step (spray step B): a DI-water spray with nitrogen as the carrier gas (continuous phase (cp)=nitrogen; disperse phase (dp)=DI-water) is sprayed onto the wafer at 25° C. at a spin speed of 1000 rpm. Nitrogen flow rate 90 sl/min (sl=standard liter 1013 hPa, 25° C.); DI-water flow rate 70 ml/min. During spraying the spray nozzle slowly scans across the wafer from the center to the edge at a speed of 10 mm/s (0.01 m/s).

$4^{th}$ step (final rinsing step R): rinsing liquid (de-ionized water) at a flow rate of 5 l/min is supplied onto the center of the wafer while it is spun at a spin speed of 300 rpm.

5th step (drying step D): rinsing liquid (de-ionized water) is removed with nitrogen-gas with 2 vol.-% 2-propanol while water is supplied onto the wafer so that a liquid-gas boundary layer is scanned from the center to edge so that the wafer remains perfectly dry after liquid removing.

This process can be summarized as the sequence of the process steps in this order R-A-B-R-D (prior art), wherein the step A takes 60 s and step B takes 45 s.

According to the current invention (example 1) the $2^{nd}$ and $3^{rd}$ process steps are repeated once leading to the order R-A-B-A-B-R-D, wherein each step A takes 30 s and step B takes 22.5 s.

Surprisingly the particle removing efficiency could be significantly increased (by more than 20%) without changing the process parameters of each step and without increasing the overall process time.

Each process step may overlap with the previous step, which helps to keep the surface wet during cleaning until it is finally dried. Such overlapping may be in a range of 0.5 s to 5 s.

Alternatively (example 2) the $2^{nd}$ and $3^{rd}$ process steps are repeated twice leading to the order R-A-B-A-B-A-B-R-D, wherein each step A takes 20 s and step B takes 15 s. Again the overall process time has not increased. This process order leads to a further increase of particle removing efficiency, although not in this significance.

Table 1 shows the two examples of the invented method (1 and 2) as well as the one comparative example (0=prior art)

TABLE 1

| Example | first fluid (A) (continuous liquid flow A) | second fluid (B) (spray step B) continuous phase (cp) disperse phase (dp)) | sequence |
|---|---|---|---|
| 0 (prior art) | SC1 - 60 s | cp: nitrogen; dp: DI-water - 45 s | R-A-B-R-D |
| 1 | SC1 - 30 s | cp: nitrogen; dp: DI-water - 22.5 s | R-A-B-A-B-R-D |
| 2 | SC1 - 20 s | cp: nitrogen; dp: DI-water - 15 s | R-A-B-A-B-A-B-R-D |

Table 2 shows the cleaning efficiency of the two examples of the invented method (1 and 2) as well as of the cited comparative example.

TABLE 2

| Example | repeating A-B | total cleaning time | particle removing efficiency |
|---|---|---|---|
| 0 (prior art) | 1× (not repeated) | 105 s | 64.2 |
| 1 | 2× | 105 s | 77.7 |
| 2 | 3× | 105 s | 78 |

Further embodiments of the invention are summarized below. Herein the abbreviations are used as follows:

A: free flow cleaning step wherein the liquid is poured onto the surface in a continuous free flow B: spray cleaning step, wherein liquid is dispensed onto the surface with a spray nozzle R: a rinsing step, wherein DI (de-ionized water) is supplied in a free flow. (in the DI-water gases such as $CO_2$ may be dissolved)

D: a drying step, which removes liquid from the surface.

R-B-A-B-R-D: This is a basic process according to the current invention wherein the core sequence B-A-B is preceded with a pre-rinse and succeeded by a rinse and dry sequence.

R-B-A1-A2-B-R-D: This example shall indicate that between the at least two spray cleaning steps two or more free flow cleaning steps may be conducted; e.g. with two different cleaning liquids.

R-B-A-B-A-R-D: The sequences may start with a spray cleaning step after the pre-rinse step.

B-A-B-A-R-D: The sequences may start with a spray cleaning step without a pre-rinse.

B-A-B-R-D: The sequences may start with a spray cleaning step without a pre-rinse and no final free flow cleaning step.

B-A-B-D: With this cleaning sequence the last (second) spray step B (between A and D) serves simultaneously as rinsing step. Thus it is preferred that a liquid is used, which evaporates without leaving any residues.

A-B-A-B-A-R-D

For step A SC1 (an aqueous solution of hydrogen peroxide and ammonia) is used. Alternatively an aqueous solution of choline (or other quaternary amines) may be used.

The invention claimed is:

1. A method for spray cleaning a surface of a plate-like article, comprising the steps:
   treating the surface with free flow cleaning, wherein liquid is dispensed through a dispense nozzle onto the surface in a continuous liquid flow,
   treating the surface with spray cleaning, wherein liquid is directed through a spray nozzle towards the surface in form of droplets,
   wherein the surface is treated with a spray cleaning step before the free flow cleaning step and a spray cleaning step after the free flow cleaning step, and at least two of the spray cleaning steps are run for 5 s to 45 s each, and the droplets have a mean diameter D30 of between 0.001 mm and 0.1 mm.

2. The method according to claim 1, wherein the sequence of a free flow cleaning step followed by a spray cleaning step is carried out at least twice.

3. The method according to claim 1, wherein at least one of the free flow cleaning steps and/or the spray cleaning steps utilizes an alkaline cleaning liquid.

4. The method according to claim 3, wherein alkaline cleaning liquid comprises an oxidizing agent selected from the group consisting of ozone, hydrogen peroxide, and a mixture of ozone and hydrogen peroxide.

5. The method according to claim 4, wherein the cleaning liquid comprises ammoniac.

6. The method according to claim 1, wherein at least one of the spray cleaning steps utilizes a cleaning liquid selected from the group comprising water, organic solvent alkaline composition, and acidic composition.

7. The method according to claim 1, wherein the free flow cleaning step and at least one of the spray cleaning steps, which are before or after the free flow step, timely overlap not more than 5 s.

8. The method according to claim 1, wherein the plate-like article is rotated during at least one cleaning step.

9. The method according to claim 1, wherein at least one of the spray cleaning steps, which are before or after the free flow step, utilizes a spray nozzle selected from the group airless spray nozzle, two phase nozzle with inner mixing or two phase nozzle with outer mixing.

10. The method according to claim 9, wherein at least one of the spray cleaning steps, which are before or after the free flow step, utilizes a two phase nozzle with outer mixing.

11. The method according to claim 9, wherein the spray nozzle's orifice is located at a distance d to the plate-like article's surface of d being in a range of 0.1 cm to 10 cm.

12. The method according to claim 1, wherein at least two of the spray cleaning steps are run for 8 s to 30 s each.

13. The method according to claim 2 wherein at least two of the free flow cleaning steps are run for 8 s to 30 s each.

14. The method according to claim 9, wherein the spray nozzle scans laterally across the plate-like article.

15. The method according to claim 9, wherein the spray nozzle's orifice is located at a distance d to the plate-like article's surface with d being in a range of 0.3 cm to 5 cm.

16. A method for spray cleaning a surface of a structured semiconductor wafer, comprising:
   A—treating the surface with free flow cleaning, wherein liquid is dispensed through a dispense nozzle onto the surface in a continuous liquid flow;
   B—treating the surface with spray cleaning, wherein liquid is directed through a spray nozzle towards the surface in form of droplets, wherein the droplets have a mean diameter D30 of between 0.001 mm and 0.1 mm;
   R—rinsing, wherein de-ionized water is supplied in a free flow; and
   D—drying to remove the liquid from the surface,
   wherein a basic process sequence is R-B-A-B-R-D with the core sequence B-A-B is preceded with a pre-rinse and succeeded by a rinse and dry sequence, and at least two of the spray cleaning steps B are run for 5 s to 45 s each.

17. The method according to claim 16, wherein the sequence is R-B-A1-A2-B-R-D where in between at least two spray cleaning steps, two or more free flow cleaning steps A1, A2 may be conducted with two different cleaning liquids.

18. The method according to claim 16, wherein the sequence is R-B-A-B-A-R-D where the core sequence B-A-B starts after the pre-rinse step R.

19. The method according to claim 1, wherein the mean diameter $D_{30}$ is calculated based upon volume distribution as follows:

$$D_{30}=(\Sigma D_i^3 N_i / \Sigma N_i)^{(1/3)},$$

wherein $D_i$ is the mean droplet diameter of each size class i of a sample, and $N_i$ is the number of droplets in each size class i.

20. The method according to claim 16, wherein the mean diameter $D_{30}$ is calculated based upon volume distribution as follows:

$$D_{30}=(\Sigma D_i^3 N_i / \Sigma N_i)^{(1/3)},$$

wherein $D_i$ is the mean droplet diameter of each size class i of a sample, and $N_i$ is the number of droplets in each size class i.

* * * * *